(12) United States Patent
Raravikar et al.

(10) Patent No.: US 7,465,605 B2
(45) Date of Patent: Dec. 16, 2008

(54) IN-SITU FUNCTIONALIZATION OF CARBON NANOTUBES

(75) Inventors: Nachiket R. Raravikar, Chandler, AZ (US); James C. Matayabas, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 480 days.

(21) Appl. No.: 11/304,403

(22) Filed: Dec. 14, 2005

(65) Prior Publication Data

US 2007/0134599 A1   Jun. 14, 2007

(51) Int. Cl.
   *H01L 51/40* (2006.01)
(52) U.S. Cl. .................. 438/99; 977/745; 977/746
(58) Field of Classification Search .............. 438/99; 257/E51.04; 977/745, 746
   See application file for complete search history.

(56) References Cited

U.S. PATENT DOCUMENTS

| 6,737,750 | B1 | 5/2004 | Hoffman et al. |
| 2004/0005736 | A1 | 1/2004 | Searls et al. |
| 2004/0261897 | A1 | 12/2004 | Zhang et al. |
| 2005/0139991 | A1 | 6/2005 | White et al. |
| 2005/0150887 | A1 | 7/2005 | Taya et al. |
| 2006/0041050 | A1* | 2/2006 | Manane et al. ............ 524/496 |
| 2006/0274049 | A1* | 12/2006 | Spath et al. ............... 345/173 |
| 2007/0098620 | A1* | 5/2007 | Khabashesku et al. ... 423/447.1 |
| 2007/0184969 | A1* | 8/2007 | Dubois et al. ............. 502/152 |
| 2007/0298669 | A1* | 12/2007 | Barrera et al. ............ 442/198 |

OTHER PUBLICATIONS

B.M. Ginzburg, "Influence of C60 Fullerence On The Oxidative Degradation of a Free Radical Poly(Methyl Methacrylate)", J. of Macromolecular Sci., vol. B42, No. 1, pp. 139-166, 2003.
B. McCarthy, et al., "A Microscopic and Spectroscopic Study of Interactions Between Carbon Nanotubes and a Conjugated Polymer", J. Phys. Chem. B 2002, vol. 106, pp. 2210-2216.
Marc in het Panhuis, "Selective Interactive in a Polymer-Single-Wall Carbon Nanotube Composite", J. Phys. Chem. B 2003, vol. 107, pp. 478-482.
N. R. Raravikar, "Synthesis and Characterization of Thickness-Aligned Carbon Nanotube-Polymer Composite Films", Chem. Mater. 2005, vol. 17, pp. 974-983.

* cited by examiner

*Primary Examiner*—Trung Dang
(74) *Attorney, Agent, or Firm*—Blakely, Sokoloff, Taylor & Zafman LLP

(57) ABSTRACT

An embodiment of the present invention is a technique to functionalize carbon nanotubes in situ. A carbon nanotube (NT) array is grown or deposited on a substrate. The NT array is functionalized in situ with a polymer by partial thermal degradation of the polymer to form a NT structure. The functionalization of the NT structure is characterized. The functionalized NT structure is processed according to the characterized functionalization.

12 Claims, 6 Drawing Sheets

IN-SITU FUNCTIONALIZATION OF CARBON NANOTUBES

BACKGROUND

1. Field of the Invention

Embodiments of the invention relate to the field of nanotechnology, and more specifically, to carbon nanotubes.

2. Description of Related Art

Carbon nanotubes are promising elements in nanotechnology. They are fullerene-related structures which consist of graphene cylinders. Applications that may be benefited using carbon nanotubes include high thermal conductivity materials for future packaging thermal demands, and highly sensitive materials for bio-recognition, and for in situ biochemical reactions on a bio-/micro-electronic chip. Such applications require an effective in-situ functionalization of carbon nanotubes.

Existing techniques for covalent or non-covalent functionalization of carbon nanotubes are insufficient to meet the above demands. In acid treatments, the vigorous acid sonication techniques introduce defects in the nanotube surface and are not in situ either. Anionic polymerization may be carried out in situ. But it needs a very careful control over chemistry, and is time consuming. Direct functionalization of polymers or larger radicals onto the nanotubes using plasma treatment has not been demonstrated yet. Currently there are no known strategies for in situ functionalization of nanotubes with polymer macro-radicals.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to functionalize carbon nanotubes in situ. A carbon nanotube (NT) array is grown on a substrate. The NT array is coated with polymer, and then functionalized in situ with a polymer by partial thermal degradation of the polymer to form a NT structure. The functionalization of the NT structure is characterized. The functionalized NT structure is processed according to the characterized functionalization and the desired application.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique to functionalize carbon nanotubes in situ by partial thermal degradation of polymer around the nanotubes. The functionalized NTs with polymer macro-radicals may have numerous applications including composites for thermal management, micro-fluidics, bio-sensing, and bio-recognition. Nanotubes are known to scavenge and stabilize the polymer macro-radicals formed during the polymer thermal degradation process. This may be observed in terms of an increase in activation energy for degradation of polymer close to the NT surface, as compared to the pure polymer. The thermal degradation temperature of such polymer is typically higher than that of the pure, bulk polymer. The interaction of NTs with polymer macro-radicals during the early stage of polymer degradation indicates that there is a covalent or non-covalent bond between the macro-radicals with the NT surface.

The technique utilizes this mechanism for surface modification of the NTs. Subsequently, these functionalized NTs may be mixed with the same or different polymer to make composites, using processes such as melt mixing, solvent mixing, or in-situ polymerization into aligned NT arrays. NT composites may also be formed by functionalizing metals onto the NTs, followed by infiltration of solders into the NT arrays. Bio-molecules may also be immobilized onto the functionalized NT assemblies to be used in bio-chips for bio-molecular recognition, bio-sensing, and in-situ biochemical reactions.

Figure 1:
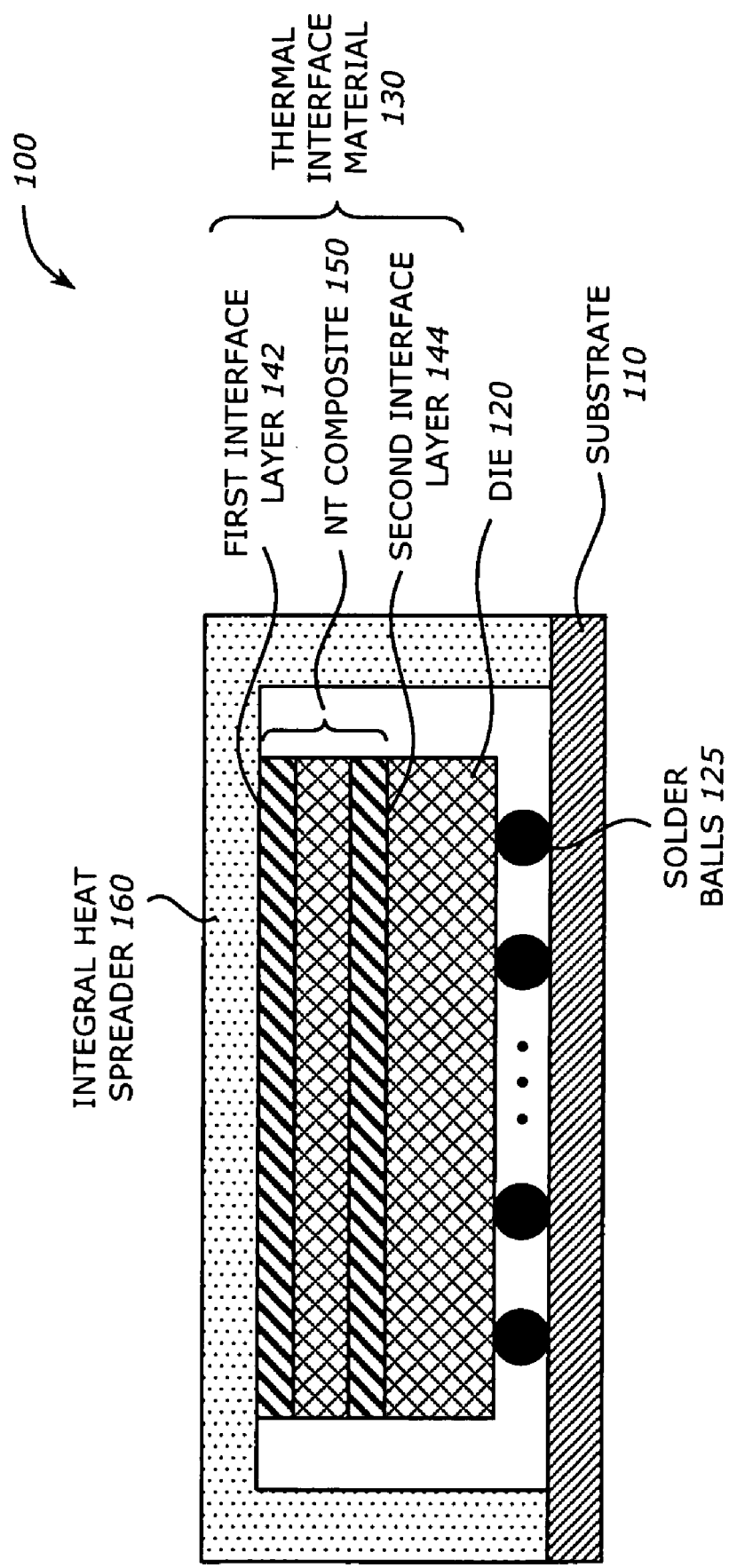
FIG. 1 is a diagram illustrating a system in which one embodiment of the invention can be practiced.

FIG. 1 is a diagram illustrating a system 100 in which one embodiment of the invention can be practiced. The system 100 represents a package device and includes a substrate 110, a die 120, and an integral heat spreader (IHS) 160.

The substrate 110 is a package substrate 110 that provides support for the die. The substrate 110 may be polymer or a composite. The die 120 is any semiconductor die. It may have a microelectronic device such as a microprocessor, a memory, an interface chip, an integrated circuit, etc. The die 120 is attached to the substrate 110 by a number of solder balls 125. The solder balls 125 provide contact with the contact pads on the substrate. The solder balls 125 may be fabricated using any standard manufacturing or fabrication techniques such as the controlled collapse chip connect (C4) technique.

The IHS 160 may house or cover the die 120 on the substrate 110. It may include a flat surface and supporting walls on both or four sides of the die 120. During operation, the die 120 may generate heat. The heat may be transferred to the IHS 160 through a thermal interface material (TIM) 130. The TIM 130 may be located, or interposed, between the bottom surface of the IHS 160 and the top surface of the die 120. It may be attached to a heat generating device, such as the die 120, to transfer the heat to a heat spreader or a heat sink or any another heat dissipating device.

The TIM 130 includes a first layer 142, a second layer 144, and a nanotube (NT) composite 150. The first and second layers 142 and 144 provide substrate on which the NT composite 150 is formed in-situ. The NT composite 150 can also be made externally and sandwiched between the layers 142 and 144. When the composite is formed in situ, the layers 142 and 144 would be one of silicon, silica, quartz or alumina, on which nanotubes are grown or deposited. These layers may be deposited or glued (e.g., using thermal glue) on the surface of the IHS 160 or the die 120 to prevent any chemical reaction that may occur between the surface and the formation of the NT composite 150. The thermal glue can be thermal grease or any thermally conducting material such as Sn solder, or tungsten, or a combination of such materials, which also show good adhesion (e.g., wetting) with the IHS 160, die 120 and the substrate layers 142 or 144. The layers 142 and 144 may also be made of thermal glue, instead of ceramic substrates, that bonds the nanotube composite 150 directly to the silicon die 120 and the IHS 160. The NT composite 150 may contain a NT structure that has high thermal conductivity to provide a heat dissipation path. There may be additional agents or catalysts, such as metals, deposited or embedded in the layers 142 and 144 to improve efficiency.

Figure 2:
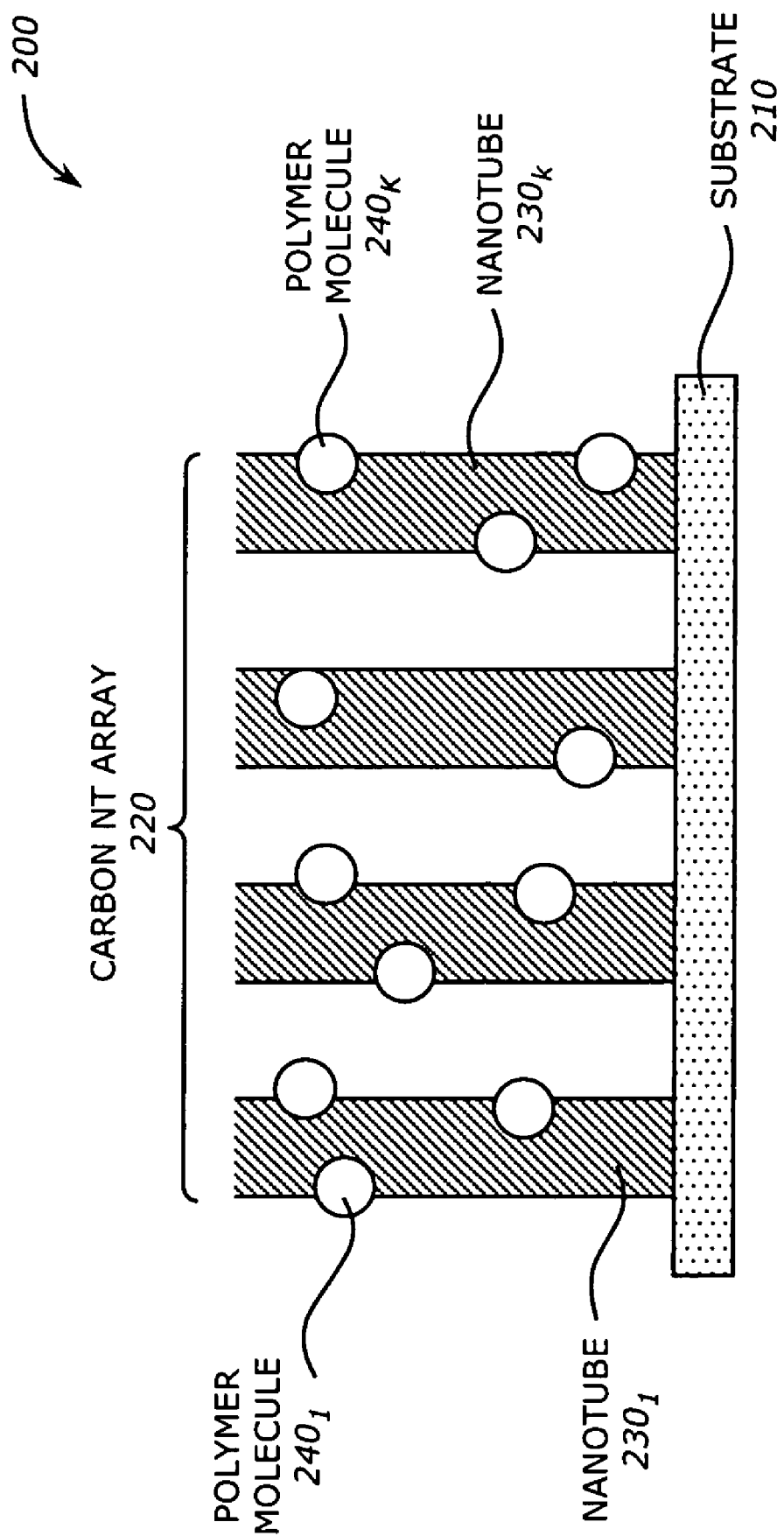
FIG. 2 is a diagram illustrating a structure of a functionalized nanotube (NT) array, according to one embodiment of the invention.

FIG. 2 is a diagram illustrating a nanotube (NT) structure 200 according to one embodiment of the invention. The NT structure 200 is formed in the NT composite 150 shown in FIG. 1. The NT structure includes a substrate 210 and a carbon NT array 220.

Figure 3:
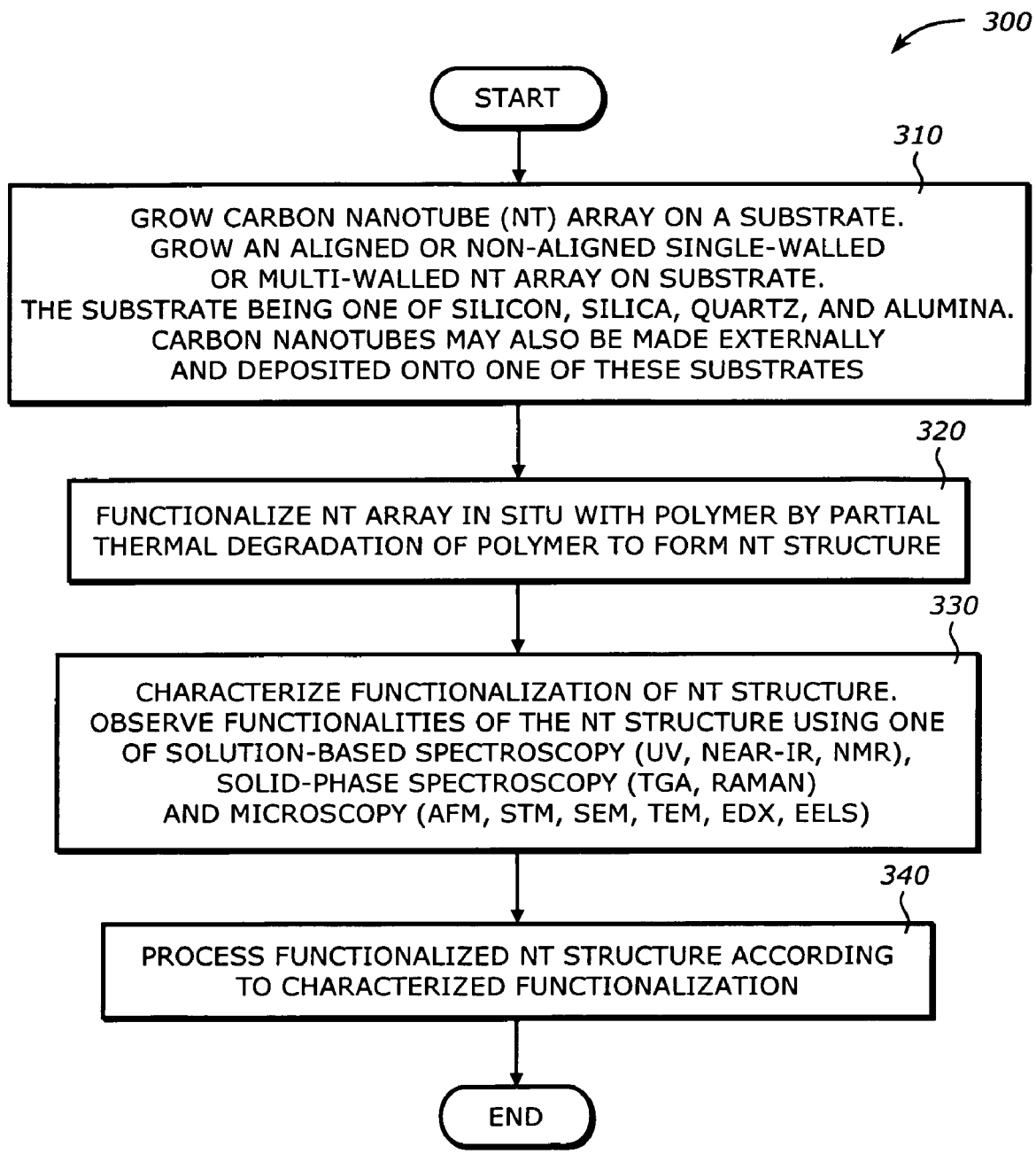
FIG. 3 is a flowchart illustrating a process to process functionalized carbon NTs for a specific application according to one embodiment of the invention.

The substrate 210 may be any one of silicon, silica, quartz, and alumina. It may be one of the first and second layers 142 and 144 shown in FIG. 1. The NT array 220 includes a number of NTs $230_1$ to $230_N$. The NTs $230_1$ to $230^N$ may be multi-walled carbon NTs (MWNT) or single walled carbon NTs. The NT array 220 may be grown in situ or externally deposited onto the substrate 210. The NT array 220 may be functionalized in-situ with polymer by partial thermal degradation. The polymer molecules $240_1$ to $240^K$ are attached to the surfaces of the NTs. The functionalized NT array 220 may be subsequently mixed with a polymer or metal to form a composite for thermal management (e.g., the TIM 130 shown in FIG. 1), or linked with bio-molecules to form a bio-chip FIG. 3 is a flowchart illustrating a process 300 to functionalize and process carbon NTs according to one embodiment of the invention.

Upon START, the process 300 grows or deposits a carbon nanotube (NT) array on a substrate (Block 310). This may be performed by growing an aligned or non-aligned single-walled or multi-walled carbon NT (MWNT) array on the substrate, or by depositing an externally prepared, typically non-aligned network of carbon nanotubes on the substrate. The substrate may be one of silicon, silica, quartz, and alumina. The growth process may be chemical vapor deposition (CVD). The process 300 functionalizes the NT array in situ with a polymer by partial thermal degradation of the polymer to form a NT structure (Block 320).

Then, the process 300 characterizes functionalization of the NT structure (Block 330). This may be performed by observing the functionalities of the NT structure using one of (1) a solution-based spectroscopy such as ultraviolet (UV), near-infrared (IR), and nuclear magnetic resonance (NMR); (2) a solid-phase spectroscopy such as thermal gravimetric analysis (TGA) and Raman spectroscopy; and (3) microscopy such as atomic force microscopy (AFM), scanning tunneling microscopy (STM), scanning electron microscopy (SEM), transmission electron microscopy (TEM) with or without X-ray spectroscopy (EDX) or electron energy loss spectroscopy (EELS). The observation may also provide measurement of the presence of the functional polymer radicals on the NT surfaces. It may also indicate qualitatively the adhesion or the type of bonding, whether a covalent or Van der Waals bond, between the polymeric radicals and the carbon NTs.

Next, the process 300 processes the functionalized NT structure according to the characterized functionalization (Block 340). The processing of the functionalized NT structure may be guided according to the particular application. The process 300 is then terminated.

Figure 4:
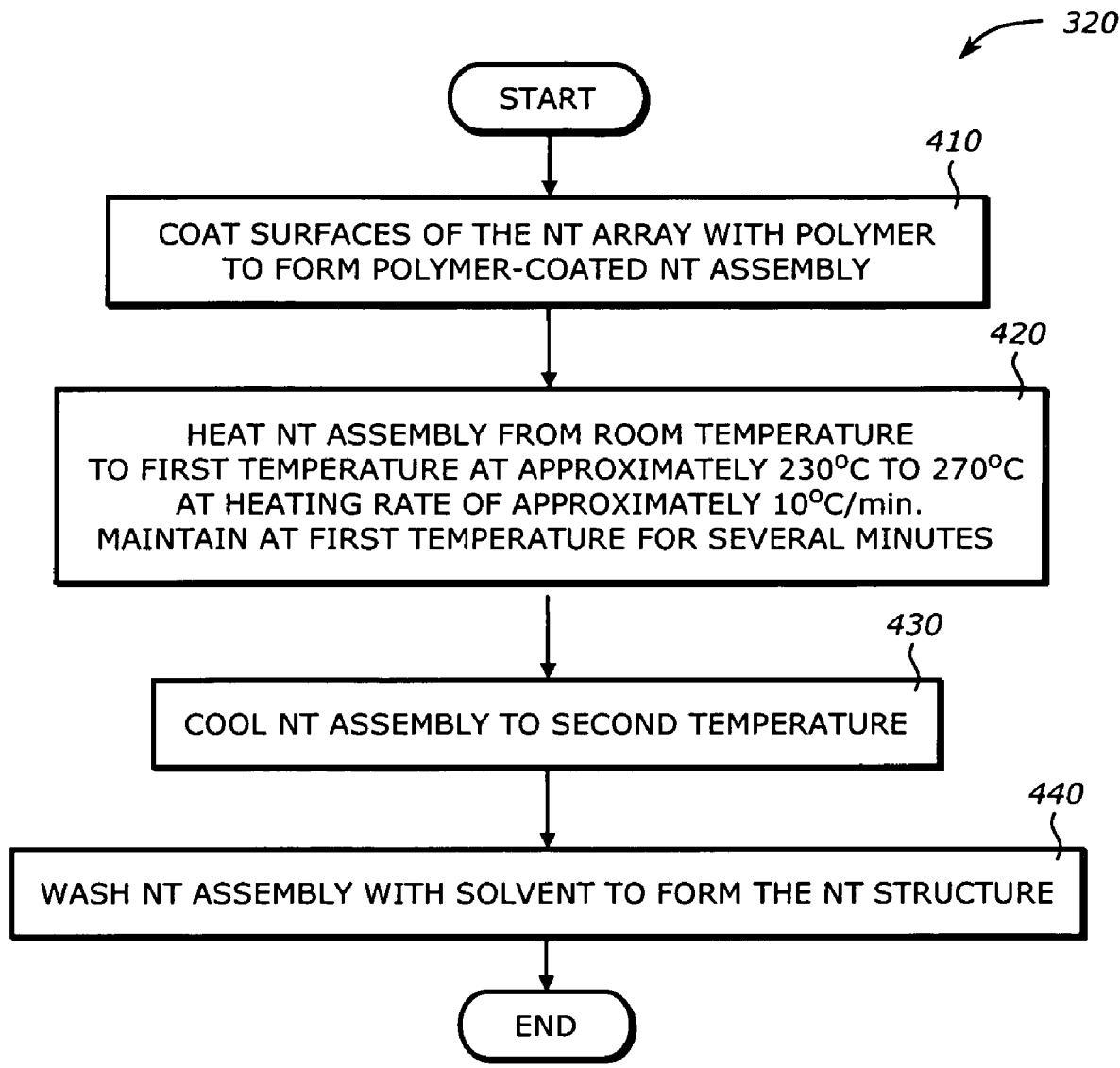
FIG. 4 is a flowchart illustrating a process to functionalize NT array according to one embodiment of the invention.

FIG. 4 is a flowchart illustrating the process 320 to functionalize NT array according to one embodiment of the invention.

Upon START, the process 320 coats surfaces of the NT array with a polymer to form a polymer-coated NT assembly (Block 410). Next, the process 320 heats the NT assembly to a first temperature (Block 420). The heating may be performed in a furnace or oven under controlled atmosphere. The first temperature may be between 200° C. to 300° C. with a desirable range from 230° C. to 270° C. The heating at the first temperature may be maintained for some time period, e.g., from a few minutes to 15 minutes. The heating may also be carried out in air or plasma. The heating rate may range from 5° C. per minute to 15° C. per minute (e.g., 10° C./minute), starting from approximately room temperature (e.g., 25° C.) to the first temperature. Then, the process 320 cools the NT assembly to a second temperature (Block 430). The second temperature may be approximately the room temperature. Next, the process 320 washes the NT assembly with a solvent to form the NT structure (Block 440). The washing washes out those polymeric radicals that are not attached to the NT surfaces. The process 320 is then terminated.

Figure 5:
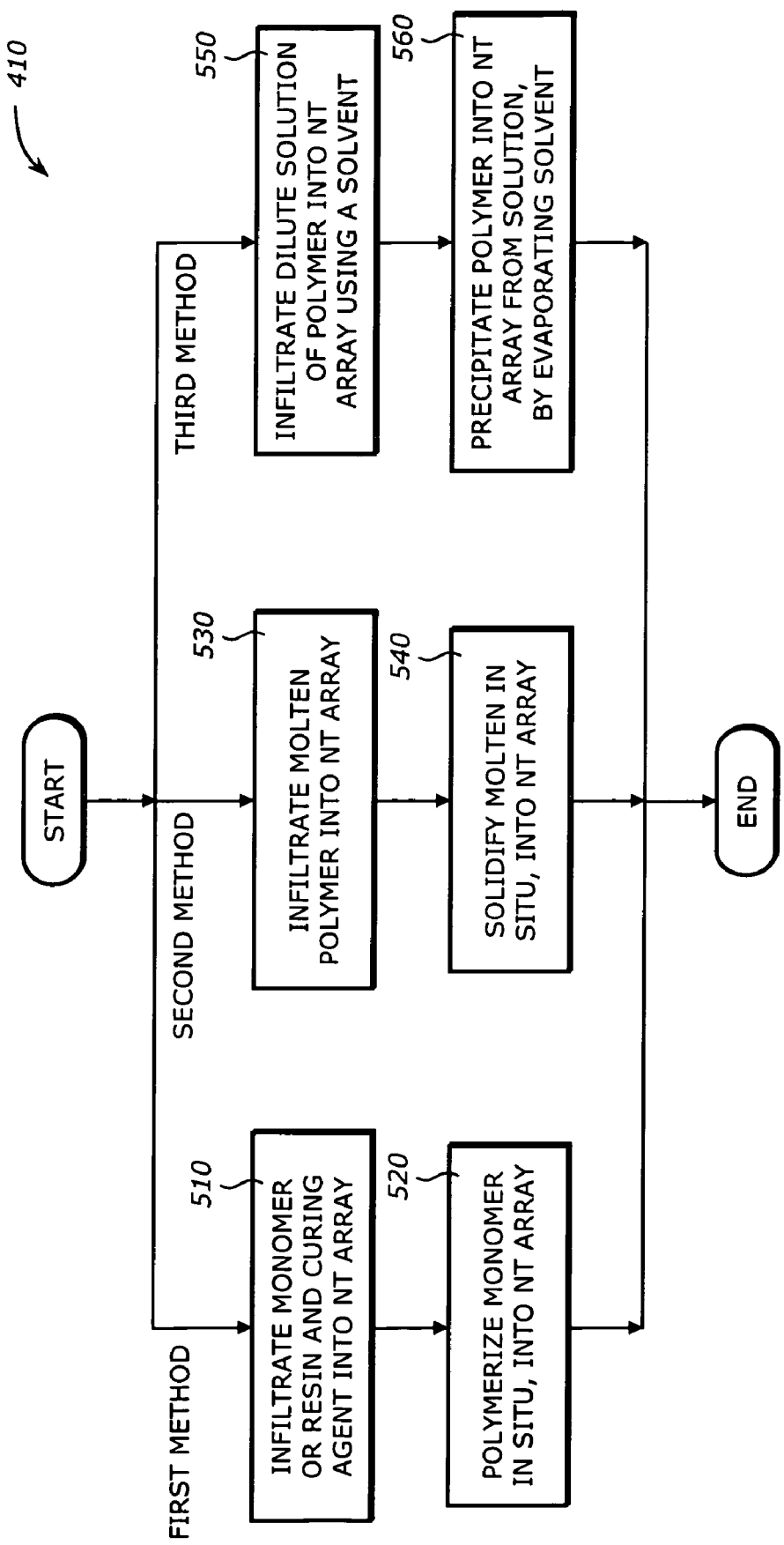
FIG. 5 is a flowchart illustrating a process to coat surfaces of NT array with polymer according to one embodiment of the invention.

FIG. 5 is a flowchart illustrating the process 410 to coat surfaces of NT array according to one embodiment of the invention. The process 410 includes three different methods.

In the first method, the process 410 infiltrates a monomer or an uncured resin along with a curing agent, into the NT array (Block 510). The monomer may be methyl methacrylate (MMA) and the uncured resin maybe the uncured epoxy resin. The uncured epoxy resin may be used in a molten form, or in a solution using a suitable solvent, which is removed (e.g., evaporated) upon curing. The curing agent may be chosen according to the type of monomer or the resin. Next, the process 410 polymerizes the monomer or resin infiltrated into NT array (Block 520), to poly (methyl methaacrylate) (PMMA) or epoxy, respectively, and is then terminated.

In the second method, the process 410 infiltrates a molten polymer into the NT array (Block 530), followed by in situ solidification. The molten polymer may be a molten PMMA, polystyrene, or polycarbonate. Next, the process 410 solidifies the molten polymer into the NT array (Block 540), and is then terminated.

In the third method, the process 410 infiltrates a dilute solution of a polymer into the NT array using a solvent (Block 550). The polymer may be polystyrene or PMMA. The solvent may be methylbenzene or phenylmethane (e.g., toluene). The solvent typically wets the nanotubes well. Next, the process 410 precipitates the polymer into the NT array from the dilute solution by evaporating the solvent (Block 560), and is then terminated.

The type of polymer functionality may be guided by the particular application. For example, PMMA macro-radicals may be useful for composites used in thermal management as well as for bio-systems; whereas polycarbonate may be useful only for thermal management.

Figure 6:
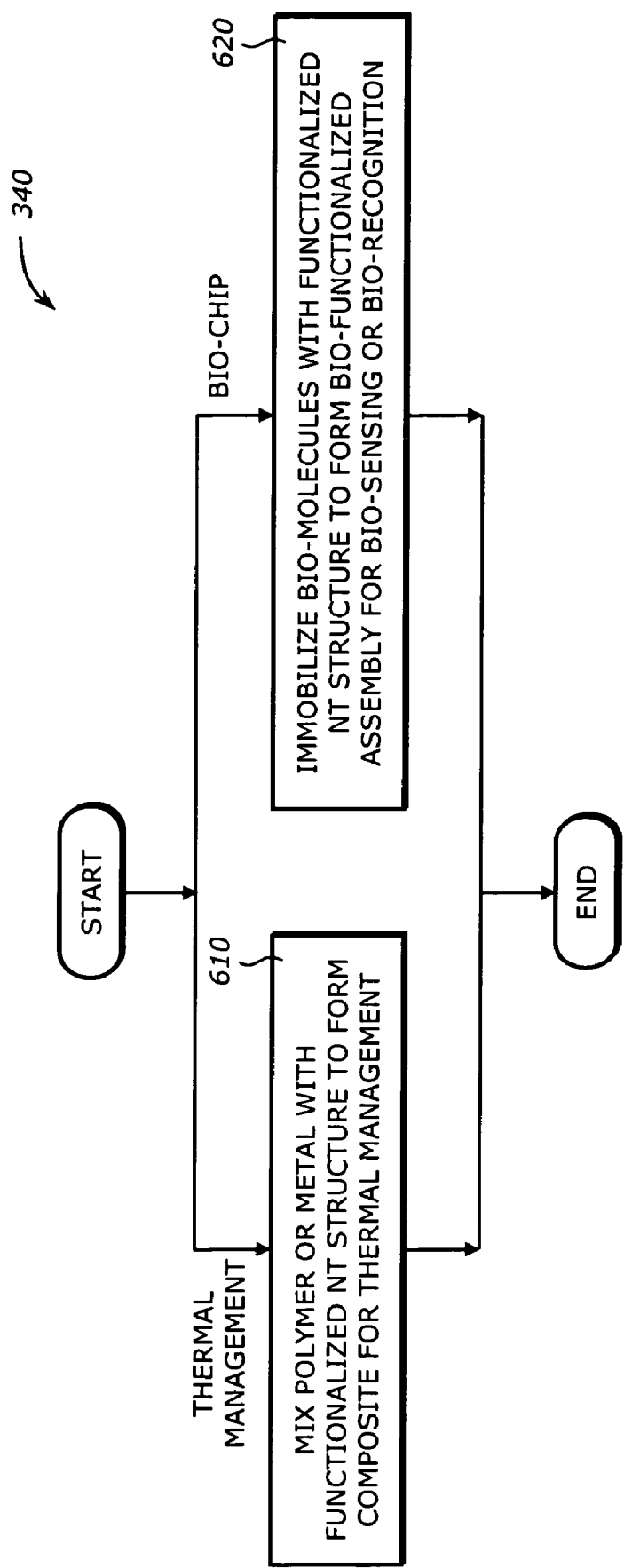
FIG. 6 is a flowchart illustrating a process to process the functionalized NT structure for a given application, according to one embodiment of the invention.

FIG. 6 is a flowchart illustrating the process 340 to process the functionalized NT structure according to one embodiment of the invention. The process 340 may be performed depending on the application. There may be two main applications: thermal management and bio-sensing or recognition.

In the thermal management application, the process 340 mixes a polymer or a metal with the functionalized NT structure to form a composite for thermal management (Block 610). The polymer used in this process may be the same or different than the polymer used in the coating process 410 shown in FIG. 4. The mixing may be performed by melt mixing, solvent mixing, or in-situ polymerization into aligned NT array. The process 340 is then terminated.

In the bio-sensing or recognition application, the process 340 immobilizes bio-molecules with the functionalized NT structure to form a bio-functionalized assembly for bio-sensing or bio-recognition (Block 620) and is then terminated.

An embodiment of the invention as described above provides many advantages. First, the process to form functionalized NT structure is simple and fast. Second, low temperatures (e.g., less than 300° C.) may be used for functionalizing the NT surface. Third, in-situ functionalization of NTs may be achieved to functionalize NTs in any orientation. Fourth, various types of polymer macro-radicals may be used to functionalize the NTs.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
    growing or depositing a carbon nanotube (NT) array on a substrate;
    functionalizing the NT array in situ with a polymer by partial thermal degradation of the polymer to form a NT structure;
    characterizing functionalization of the NT structure;
    processing the functionalized NT structure according to the characterized functionalization.

2. The method of claim 1 wherein growing or depositing the carbon NT array comprises:
    growing or depositing an aligned or non-aligned single-walled or multi-walled carbon NT array on the substrate being one of silicon, silica, quartz, and alumina.

3. The method of claim 1 wherein functionalizing the NT array comprises:
    coating surfaces of the NT array with a polymer to form a polymer-coated NT assembly;
    heating the NT assembly to a first temperature;
    cooling the NT assembly to a second temperature; and
    washing the NT assembly with a solvent to form the NT structure.

4. The method of claim 3 wherein coating the surface of the NT comprises:
    infiltrating a monomer or an uncured resin along with a curing agent, into the NT array; and
    polymerizing the monomer in situ into the NT array.

5. The method of claim 3 wherein coating the surface of the NT comprises:
    infiltrating a molten polymer into the NT array; and
    solidifying the molten polymer in situ into the NT array.

6. The method of claim 3 wherein coating the surface of the NT comprises:
    infiltrating a dilute solution of the polymer into the NT array using a solvent; and
    precipitating the polymer into the NT array by evaporating the solvent.

7. The method of claim 3 wherein heating the NT assembly comprises:
    heating the NT assembly from a normal temperature to the first temperature at a heating rate; and
    maintaining the heated NT assembly at the first temperature for a time period.

8. The method of claim 7 wherein heating the NT assembly comprises:
    heating the NT assembly from the normal temperature to the first temperature at the heating rate, the normal temperature being approximately a room temperature, the first temperature ranging from 230° C. to 270° C., and the heating rate ranging from 5° C. per minute to 15° C. per minute.

9. The method of claim 7 wherein maintaining the heated NT assembly comprises:
    maintaining the heated NT assembly for the time period up to 15 minutes.

10. The method of claim 1 wherein characterizing the functionalization of the NT structure comprises:
    observing functionalities of the NT structure using one of a solution-based spectroscopy, a solid-phase spectroscopy, and microscopy.

11. The method of claim 1 wherein processing the functionalized NT structure comprises:
    mixing a polymer or a metal with the functionalized NT structure to form a composite for thermal management.

12. The method of claim 1 wherein processing the functionalized NT structure comprises:
    immobilizing bio-molecules with the functionalized NT structure to form a bio-functionalized assembly for bio-sensing or bio-recognition.

* * * * *